(12) United States Patent
Ahmad et al.

(10) Patent No.: US 9,891,843 B2
(45) Date of Patent: Feb. 13, 2018

(54) ODD/EVEN INVERT CODING FOR PHASE CHANGE MEMORY WITH THERMAL CROSSTALK

(71) Applicant: KUWAIT UNIVERSITY, Safat (KW)

(72) Inventors: Imtiaz Ahmad, Shuwaikh (KW); Areej Helmi Hamouda, Hawally (KW); Mohammad G H. Alfailakawi, Mubrik Alkabeer (KW)

(73) Assignee: KUWAIT UNIVERSITY, Safat (KW)

( * ) Notice: Subject to any disclaimer, the term of this patent is extended or adjusted under 35 U.S.C. 154(b) by 131 days.

(21) Appl. No.: 15/012,748

(22) Filed: Feb. 1, 2016

(65) Prior Publication Data

US 2017/0220266 A1    Aug. 3, 2017

(51) Int. Cl.
*G06F 3/06*    (2006.01)

(52) U.S. Cl.
CPC ........... *G06F 3/0616* (2013.01); *G06F 3/064* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 6,862,235 B2 | 3/2005 | Sakata et al. |
| 6,965,533 B2 | 11/2005 | Sakata et al. |
| 7,505,330 B2 | 3/2009 | Pawlowski et al. |
| 8,386,883 B2 | 2/2013 | Franceschini et al. |

OTHER PUBLICATIONS

K. Cai, "Vertical Constrained Coding for Phase-Change memory with Thermal Crosstalk," In Proceedings of the IEEE International Conference on Computing, Networking and Communications, pp. 312-316, Feb. 2014.
A. P. Ferreira, M. Zhou, S. Bock, B. Childers, R. Melhem, and D. Mosse, "Increasing PCM Main Memory Lifetime," In Proceedings of the Conference on Design, Automation and Test in Europe, pp. 914-919, 2010.
A. Mirhoseini et al., "Phase Change Memory Write Cost Minimization by Data Encoding", IEEE Journal on Emerging and Selected Topics in Circuits and Systems, vol. 5, No. 1 (Mar. 2015), pp. 51-63.

*Primary Examiner* — Midys Rojas
(74) *Attorney, Agent, or Firm* — Richard C. Litman

(57) ABSTRACT

The odd/even invert coding for phase change memory with thermal crosstalk devises a cost model that captures Phase Change Memory (PCM) SET/RESET write asymmetries, as well as write disturbs caused by thermal crosstalk. The cost is computed by counting the different types of transitions between the old and the new data to be written to PCM. An Odd/Even Invert data encoding/decoding algorithm makes intelligent decisions based on a cost model by taking into account the number of bit flips, write asymmetry, as well as write disturbs. The data encoding algorithm recodes the data on the fly based on selective inverting (even, odd, or full invert) to search for a minimum cost solution with aim at reducing write activities and extending the PCM lifetime. A hardware architecture for the present encoding/decoding algorithm is presented that requires only two bits storage overhead for coding, regardless of the width of data.

12 Claims, 4 Drawing Sheets

ODD/EVEN INVERT CODING FOR PHASE CHANGE MEMORY WITH THERMAL CROSSTALK

BACKGROUND OF THE INVENTION

1. Field of the Invention

The present invention relates generally to electronic circuits and devices having phase change memory, and particularly to odd/even invert coding for phase change memory with thermal crosstalk.

2. Description of the Related Art

In phase change memory (PCM), a phase change material, such as Germanium-Antimony-Telluride (GST) or other chalcogenide material, is used. However, it has been discovered that PCM can suffer from reliability problems. For example, the performance of a PCM cell can eventually degrade as the cell is continually set/reset. Thus, PCM has limited write endurance, hindering its widespread usage. Moreover, a critical reliability issue caused by PCM cell down scaling is thermal crosstalk, which leads to the change of a cell's state while its adjacent cells are being programmed by a high-current reset pulse.

Thus, an odd/even invert coding for phase change memory with thermal crosstalk solving the aforementioned problems is desired.

SUMMARY OF THE INVENTION

The odd/even invert coding for phase change memory with thermal crosstalk includes a cost model that captures Phase Change Memory (PCM) SET/RESET write asymmetries, as well as write disturbs commonly caused by thermal crosstalk. The cost is computed by counting the different types of transitions between the old and the new data to be written to PCM. An Odd/Even Invert data encoding/decoding algorithm makes intelligent decisions based on the cost model by taking into account the number of bit flips, write asymmetry, as well as write disturbs. The data encoding algorithm recodes the data on the fly based on selective inverting (even, odd, or full invert) to search for a minimum cost solution with the aim of reducing write activities and extending the PCM lifetime. A hardware architecture for the present encoding/decoding algorithm is presented, which requires only two bits storage overhead for coding, regardless of the width of data.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
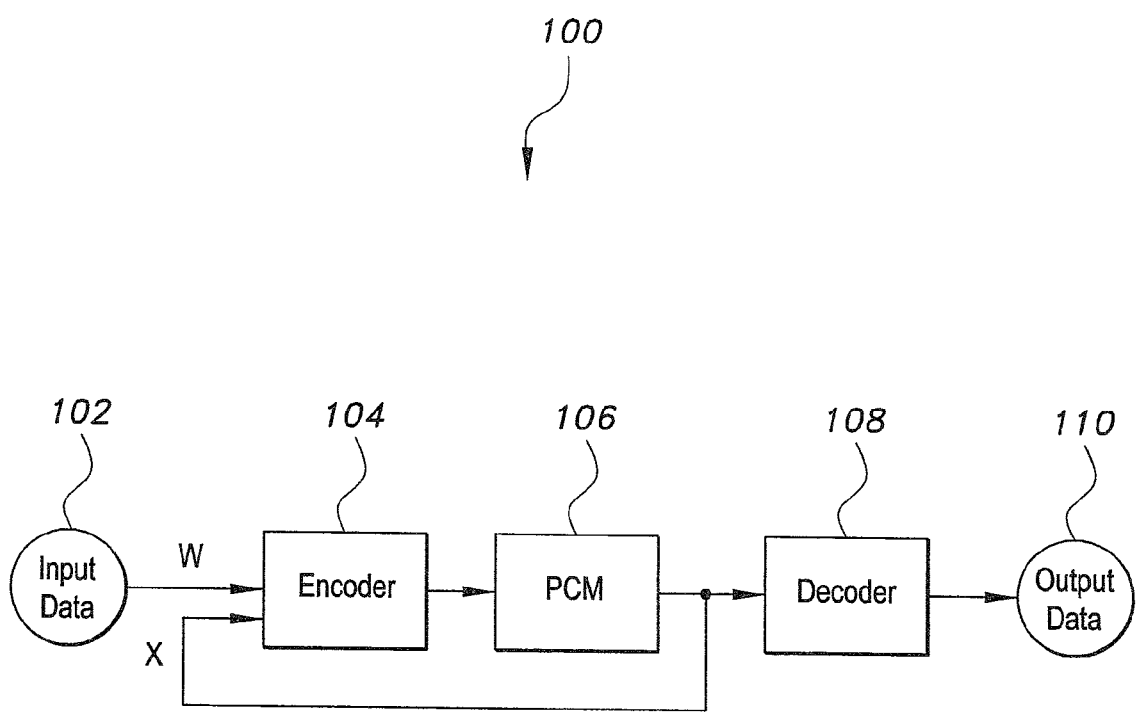
FIG. 1 is a block diagram showing overall dataflow in a system implementing odd/even invert coding for phase change memory with thermal crosstalk according to the present invention.

The present odd/even invert coding for phase change memory (PCM) with thermal crosstalk uses an algorithm that is based on DCW (data-comparison-write). In DCW, input data to be written (w) is compared to the already programmed data (x), and only bit positions with different values (between old and new) are written. The cost of writing a data word w into the PCM can be formulated similar to CAFO (Cost Aware Flip Optimization) as:

$$\text{Cost}(w) = \alpha T_{1 \to 0} + \beta T_{0 \to 1} + \gamma T_{0 \to 0} + \delta T_{1 \to 1}, \quad (1)$$

where $\alpha, \beta, \gamma, \delta$ are the scaling factors for determining the cost and are based on the memory technology being modeled and the objective function being optimized. In equation (1), $T_{1 \to 0}$ represents the number of $1 \to 0$ transitions, where the old data bit, which has a value 1, is to be modified to 0 by the new data bit. Similarly, other $T_i$ represent the corresponding marked transitions. The asymmetry of writing "0" or "1" can be captured through assigning different values to scaling factors ($\alpha, \beta$). For example, in terms of current, $\alpha$ may be two times $\beta$, since writing "0" requires more current than writing "1". Since the PCM does not require programming for matched transitions ($T_{0 \to 0}, T_{1 \to 1}$) based on DCW, their scaling factors ($\gamma, \delta$) can be assigned a value of "0" and can be ignored in equation (1).

If the complement/invert of the data, i.e., ($\overline{w}$) is to be written instead of the original one, this will result in converting the transition from one type to another, as shown in Table 1. For example, when writing ($\overline{w}$) instead of (w), all $T_{1 \to 0}$ transitions in original data (w) will be converted to $T_{1 \to 1}$ in ($\overline{w}$), all $T_{1 \to 1}$ transitions in (w) will be converted to $T_{1 \to 0}$ in ($\overline{w}$), and so on. Thus, we can derive the cost model for writing the inverted data word by replacing the corresponding transitions in equation (1) as follows (excluding matched transitions terms):

$$\text{Cost}(\overline{w}) = \alpha T_{1 \to 1} + \beta T_{0 \to 0}. \quad (2)$$

Equation (2) computes the cost based on the transitions in the original data to be written (w) and the old data value (x) at a location without inverting w. By counting the different types of transitions, these cost functions provide a simple, systematic, and powerful way of capturing write asymmetry and provide a means to make intelligent decisions to find a better cost, instead of the simple approach of counting the number of bit flips that is commonly used in conventional techniques.

TABLE 1

Effect of inversion on transition type

| Original data | Inverted data |
| --- | --- |
| $T_{1 \to 0}$ | $T_{1 \to 1}$ |
| $T_{0 \to 1}$ | $T_{0 \to 0}$ |
| $T_{0 \to 0}$ | $T_{0 \to 1}$ |
| $T_{1 \to 1}$ | $T_{1 \to 0}$ |

Consider an 8-bit data word ($w_7, w_6, w_5, w_4, w_3, w_2, w_1, w_0$) to be written to PCM. We can partition the word into two 4-bit words, including an odd-bits word ($w_7, w_5, w_3, w_1$) and an even-bits word ($w_6$, $w_4$, $w_2$, $w_0$). To derive the cost model using odd and even inverted data bits, we can use the fact that any transition can be written as the sum of odd and even bit transitions. As an example, we can write $T_{0\to1} = T_{0\to1(odd)} + T_{0\to1(even)}$. When only odd bit positions of a data word are inverted, then only the transitions at odd data bits are inverted, without affecting even bits transitions. Therefore, all the 1→0 transitions and 0→1 transitions in odd inverted data bits can be written as:

$$T_{1\to0(odd\text{-}inverted)} = T_{1\to1(odd)} + T_{1\to0(even)} \text{ and}$$

$$T_{0\to1(odd\text{-}inverted)} = T_{0\to0(odd)} + T_{0\to1(even)}.$$

By substituting these values in equation (1) and ignoring matching bits transition in equation (1) (since their scaling factors γ, δ are assigned a value of "0"), we derive the following cost model of writing odd inverted data bits:

$$\text{Cost}(\overline{w})_{odd} = \alpha(T_{1\to1(odd)} + T_{1\to0(even)}) + \beta(T_{0\to0(odd)} + T_{0\to1(even)}). \quad (3)$$

Based on the same argument, the cost model of writing even inverted data bits will be:

$$\text{Cost}(\overline{w})_{even} = \alpha(T_{1\to1(even)} + T_{1\to0(odd)}) + \beta(T_{0\to0(even)} + T_{0\to1(odd)}). \quad (4)$$

Since the number of transitions will vary in equations (1-4) based on the operation performed on the data word to be written, we seek to select the operation (no invert, full invert, odd invert, even invert) that will lead to the least cost by selecting the one that provides the least number of transitions. In our proposed cost model, we count all the transitions (matching and non-matching) and differentiate them at a finer grain level based on the position of data bits (odd or even) to compute the cost of a particular encoding. The cost models in equations (1-4) provide us a simple and powerful tool to encode data bits in such a way as to reduce the number of bits to be written, which, in turn, extends the lifetime of PCM.

With respect to the odd/even invert algorithm, the present Odd/Even Invert encoding/decoding algorithm uses two auxiliary bits to store encoding information, as shown in Table 2. The algorithm computes the cost according to equations (1-4) and selects minimum encoding cost for the data, as shown in Algorithm 1 in Table 3. The decoding procedure is also very simple and is shown as Algorithm 2 in Table 4. The decoding process starts by reading the data from the PCM, and then the corresponding encoding bits are used to transform the read data to the original format.

TABLE 2

Bit representation for coding

| Function | Odd, Even |
| --- | --- |
| Default (no encoding) | 00 |
| Invert even position bits | 01 |
| Invert odd position bits | 10 |
| Full Invert | 11 |

TABLE 3

Odd/Even Invert Encoding Algorithm 1

| Step | Function |
| --- | --- |
| 1 | //Odd, Even : Auxiliary coding bits |
| 2 | // w : n-bit data word to be written |
| 3 | Compute cost according to equations (1-4); |
| 4 | Odd=0; |
| 5 | Even=0; |
| 6 | if ($\text{Cost}(\overline{w})_{even}$ is the minimum) then |
| 7 | Invert even position bits in w; |
| 8 | Even=1; |
| 9 | else if ($\text{Cost}(\overline{w})_{odd}$ is the minimum) then |
| 10 | Invert odd position bits in w; |
| 11 | Odd=1; |
| 12 | else if ($\text{Cost}(\overline{w})$ is the minimum) then |
| 13 | Invert all bits in w; |
| 14 | Even=1; |
| 15 | Odd=1; |
| 16 | end if |

TABLE 4

Odd/Even Invert Decoding Algorithm 2

| Step | Function |
| --- | --- |
| 1 | //Odd, Even : Auxiliary coding bits |
| 2 | // w : n-bit data word to be read |
| 3 | case (Odd, Even) |
| 4 | 00: w; |
| 5 | 01: Invert even bits in w; |
| 6 | 10: Invert odd position bits in w; |
| 7 | 11: Invert all bits in w; |
| 8 | end case |

To demonstrate the capabilities of the present algorithm, we will compare its performance with that of Flip-N-Write. For example, consider an 8-bit data w=11110101 to be written in place of the value x=01011011. Assuming values of α=β=1, γ=δ=0, the present approach will find the minimum cost of 1 for inverting only bits at odd positions. On the other hand, the Flip-N-Write approach will give a cost of 3, which is the result of inverting all bits, since the number of flips for the new value is more than N/2 (5 bit flips, where N is 8). Table 5 summarizes the results by showing the encoded data, as well as cost calculations for both approaches. Furthermore, by changing the values of scaling parameters, the present Odd/Even Invert algorithm can capture the asymmetry of PCM write operations (SET/RESET) and can explore the solution space effectively to find the minimum cost data encoding to extend the lifetime of the PCM.

TABLE 5

Present Algorithm vs Flip-N-Write comparative example

| | Flip-N-Write | Present Algorithm |
| --- | --- | --- |
| Encoding | Invert all the bits | Invert only odd position bits |
| Encoded data | 00001010 | 01011111 |
| # of bit flips | 3 | 1 |
| # of transitions | $T_{1\to0(odd)} = 2$, $T_{1\to0(even)} = 0$, $T_{1\to0} = 2$ | |
| | $T_{0\to1(odd)} = 2$, $T_{0\to1(even)} = 1$, $T_{0\to1} = 3$ | |
| | $T_{0\to0(odd)} = 0$, $T_{0\to0(even)} = 0$, $T_{0\to0} = 0$ | |
| | $T_{1\to1(odd)} = 0$, $T_{1\to1(even)} = 3$, $T_{1\to1} = 3$ | |
| Cost calculations | Cost(w) = 5, $\text{Cost}(\overline{w}) = 3$, | |
| | $\text{Cost}(\overline{w})_{odd} = 1$, $\text{Cost}(\overline{w})_{even} = 7$ | |

Figure 2:
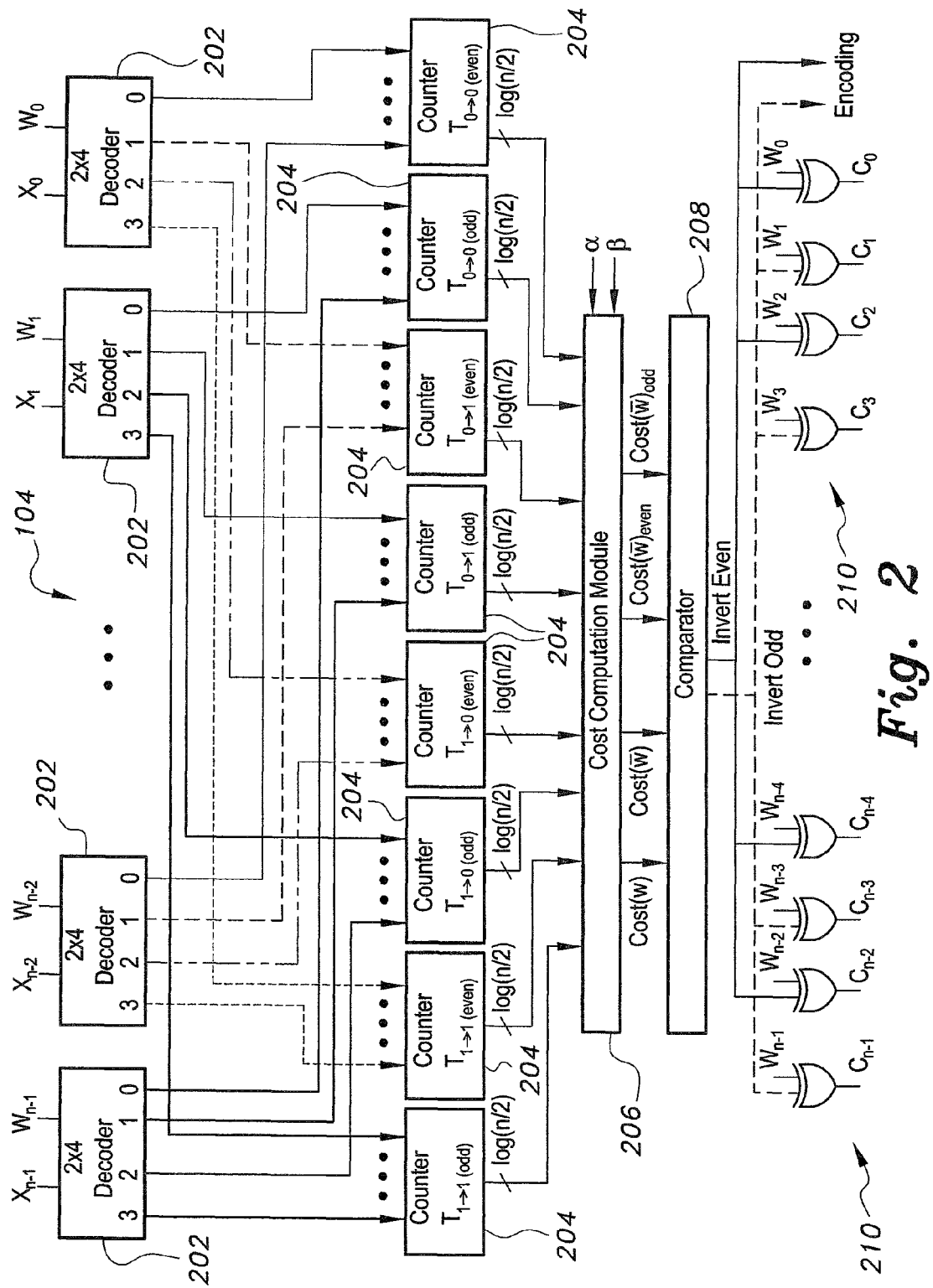
FIG. 2 is a block diagram showing the architecture of an encoder in a system implementing odd/even invert coding for phase change memory with thermal crosstalk according to the present invention.
Figure 3:
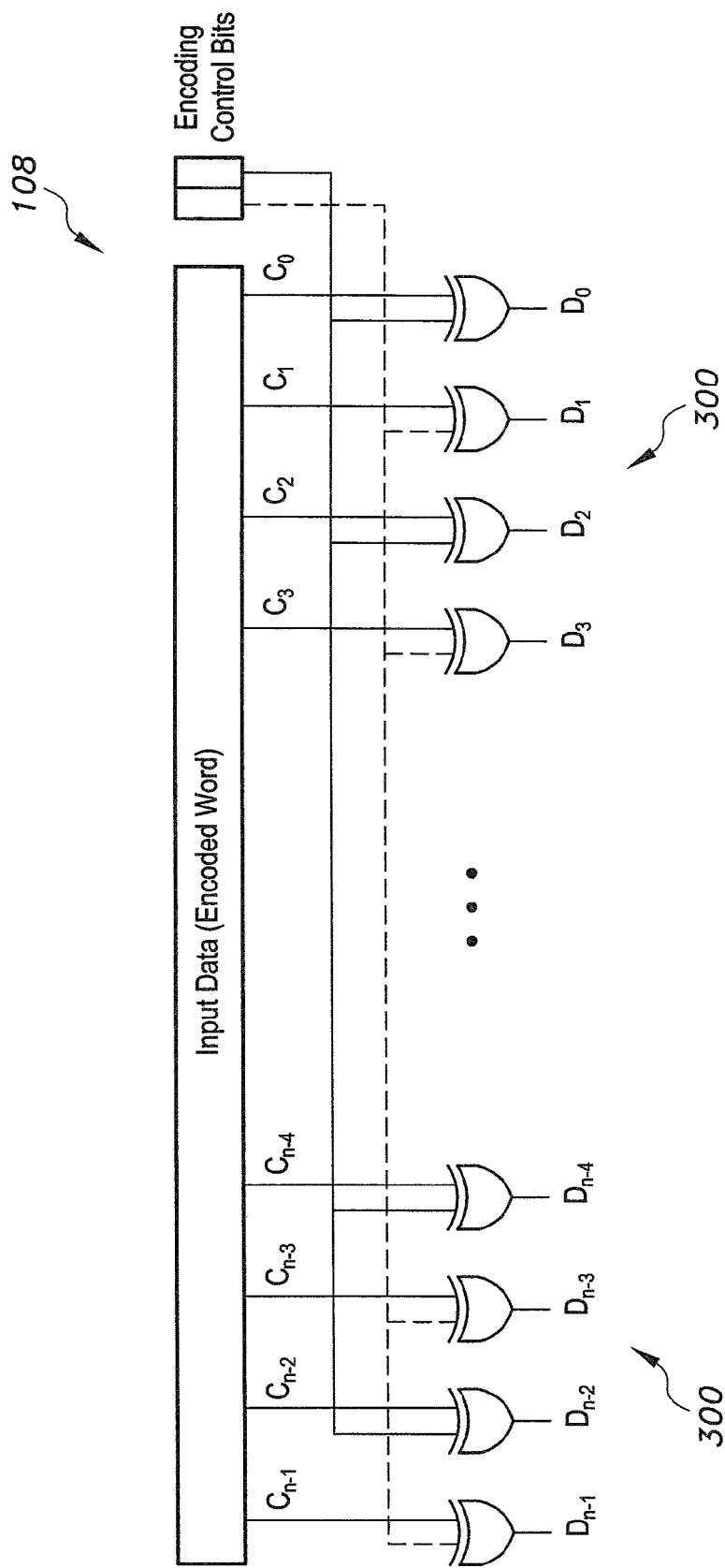
FIG. 3 is a block diagram showing the architecture of a decoder in a system implementing odd/even invert coding for phase change memory with thermal crosstalk according to the present invention.

The overall dataflow architecture 100 of the system is shown in FIG. 1, in which the new data (input data 102), i.e., w, to be written to the PCM 106 is first transformed by an encoder 104 (before being written to the PCM 106) using the pre-existing data, x, read from the PCM 106. During a read operation, the read data word is manipulated by the decoder 108 to reconstruct the original value before being outputted (as output data 110) from the system. The present encoding architecture 210 is shown in FIG. 2. The inputs to the encoder 104 are the old data $(x_{n-1}, x_{n-2}, \ldots, x_1, x_0)$ and new data $(w_{n-1}, w_{n-2}, \ldots, w_1, w_0)$ to be written to the PCM 106. The 2×4 decoder circuit 202 at the inputs detects the type of transition $(T_{0 \to 0}, T_{0 \to 1}, T_{1 \to 0}, T_{1 \to 1})$ based on its inputs $(x_i, w_i)$. Since our cost model differentiates between odd and even bit position transitions, we use separate counters 204 to count each type of transition at even and odd bit positions. Each counter circuit 204 counts the number of 1's at its input and produces a count value at the output, which has a width of $\log_2(n/2)$, where n is the size of the data word in bits. The counter outputs are then fed to a cost computation module 206, which computes the cost according to equations (1-4). Finally, a comparator circuit 208 selects the appropriate encoding operation to be performed (Odd Invert, Even Invert) based on the minimum cost generated by the cost computation module. The encoding bits are stored with the encoded data 210 for later use during the read operation. The encoding architecture can be easily pipelined, if needed. The architecture of the decoder 108 is very simple and consists of only XOR gates 300, as shown in FIG. 3. Once the data from the PCM 106 is read, the decoder 108 inverts the corresponding data bits based on the stored encoding bits to restore the original/true value.

With respect to extension for thermal crosstalk, a critical reliability issue in PCM is the write disturb problem (also known as thermal crosstalk), which arises from inter-cell thermal heating during programming. When programming a PCM cell, in particular, undergoing a reset, the generated heat may disseminate to its neighbors, thus disturbing idle cells that have a stored value of "0". A write operation will not cause any disturb problem if all cells in a memory line are updated concurrently. However, most of the existing techniques proposed to extend PCM lifetime only perform differential writes, where only bit positions that will flip will actually be written. These schemes leave many cells idle during writes, so disturbs may appear along a word-line. Write disturbs are different from resistance drift phenomena, which result in a resistance change even when a cell or its neighbor is not being accessed.

In order to take into account thermal crosstalk effect, we need to count the number of coupling transitions that induce disturbs and include them in the cost model proposed. Coupling transitions happen between two adjacent bits of inputs (e.g., $x_1 x_0 w_1 w_0$, $x_2 x_1 w_2 w_1$, $x_3 x_2 w_3 w_2$, etc.), where $(x_{n-1}, x_{n-2}, \ldots, x_1, x_0)$ is the old data and $(w_{n-1}, w_{n-2}, \ldots, w_1, w_0)$ is the new data in data word W to be written to the PCM 106. Table 6 shows all sixteen possible coupling transitions among the data bits, where these transitions are being expressed as $(T_{x_{i+1} x_i \to w_{i+1} w_i})$. The transitions $(T_{01 \to 00}, T_{10 \to 00})$ are the only ones that can create write disturbs, since one of the cells is idle in reset state, while the neighboring cell is being reset. The transitions that contribute to thermal coupling have been marked by an asterisk for no, full, and odd bit inverted data in Table 6. Since such transitions will vary based on the operation performed on the data word, we seek to select the operation (no, invert, odd, or even invert) that will lead to the least number of these transitions. To take into consideration the write disturb effect, transitions $(T_{01 \to 00}, T_{10 \to 00})$ in column number 1 of Table 6 may lead to disturbs and need to be included in the cost function. These transitions are computed by considering each pair of bits in the new data to be written with respect to the currently stored value in the PCM in order to minimize the thermal crosstalk effects.

The cost of writing a data word w in PCM described in equation (1) can be extended to include the thermal crosstalk effect as:

$$\text{Cost}(w) = \alpha T_{1 \to 0} + \beta T_{0 \to 1} + \gamma T_{0 \to 0} + \delta T_{1 \to 1} + k(T_{01 \to 00} + T_{10 \to 00}) \quad (5)$$

where k is the scaling factor for coupling transitions in the cost function.

By inverting the data as shown in Table 6, the $T_{01 \to 00}$ and $T_{01 \to 11}$ transitions in original data will be converted to $T_{01 \to 11}$ and $T_{01 \to 00}$ in the inverted data, respectively. Based on the same logic and analyzing the disturb effect in this case, $T_{01 \to 11}$, $T_{10 \to 11}$ are the transitions in original data that may lead to thermal crosstalk if the inverted data is to be written instead (as shown in column number 2 of Table 6). Thus, we can extend the cost function of writing inverted data in equation (2) by including the coupling transitions as follows:

$$\text{Cost}(\overline{w}) = \alpha T_{1 \to 1} + \beta T_{0 \to 0} + k(T_{01 \to 11} + T_{10 \to 11}). \quad (6)$$

TABLE 6

Effect of inversions on coupling transitions

| Coupling Transition $T_{Old\_data \to New\_data}$ | Coupling Transition $T_{Old\_data \to Inverted\_new\_data}$ | Coupling Transition (odd-even pair) $T_{Old\_data \to Odd\_inverted\_new\_data}$ | Coupling Transition (even-odd pair) $T_{Old\_data \to Odd\_inverted\_new\_data}$ |
|---|---|---|---|
| $T_{00 \to 00}$ | $T_{00 \to 11}$ | $T_{00 \to 10}$ | $T_{00 \to 01}$ |
| $*T_{01 \to 00}$ | $T_{01 \to 11}$ | $T_{01 \to 10}$ | $T_{01 \to 01}$ |
| $*T_{10 \to 00}$ | $T_{10 \to 11}$ | $T_{10 \to 10}$ | $T_{10 \to 01}$ |
| $T_{11 \to 00}$ | $T_{11 \to 11}$ | $T_{11 \to 10}$ | $T_{11 \to 01}$ |
| $T_{00 \to 01}$ | $T_{00 \to 10}$ | $T_{00 \to 11}$ | $T_{00 \to 00}$ |
| $T_{01 \to 01}$ | $T_{01 \to 10}$ | $T_{01 \to 11}$ | $*T_{01 \to 00}$ |
| $T_{10 \to 01}$ | $T_{10 \to 10}$ | $T_{10 \to 11}$ | $*T_{10 \to 00}$ |
| $T_{11 \to 01}$ | $T_{11 \to 10}$ | $T_{11 \to 11}$ | $T_{11 \to 00}$ |
| $T_{00 \to 10}$ | $T_{00 \to 01}$ | $T_{00 \to 00}$ | $T_{00 \to 11}$ |
| $T_{01 \to 10}$ | $T_{01 \to 01}$ | $*T_{01 \to 00}$ | $T_{01 \to 11}$ |
| $T_{10 \to 10}$ | $T_{10 \to 01}$ | $*T_{10 \to 00}$ | $T_{10 \to 11}$ |
| $T_{11 \to 10}$ | $T_{11 \to 01}$ | $T_{11 \to 00}$ | $T_{11 \to 11}$ |
| $T_{00 \to 11}$ | $T_{00 \to 00}$ | $T_{00 \to 01}$ | $T_{00 \to 10}$ |
| $T_{01 \to 11}$ | $*T_{01 \to 00}$ | $T_{01 \to 01}$ | $T_{01 \to 10}$ |
| $T_{10 \to 11}$ | $*T_{10 \to 00}$ | $T_{10 \to 01}$ | $T_{10 \to 10}$ |
| $T_{11 \to 11}$ | $T_{11 \to 00}$ | $T_{11 \to 01}$ | $T_{11 \to 10}$ |

When the data at odd bits positions is inverted, we need to consider two coupling transitions based on the pair of bits being considered. Considering the odd-even pair of bits, transitions ($T_{01 \to 10}$, $T_{10 \to 10}$) in the original data word will cause a disturb fault if only odd bits are inverted, whereas in the case for even-odd pair of bits, transitions ($T_{01 \to 01}$, $T_{10 \to 01}$) may cause disturbs in the case when only even bits are inverted. All these cases for the various inversions relative to the original data are highlighted in Table 6. Therefore, the cost of writing odd position inverted data bits by extending the cost function described in equation (3) to include coupling transitions that cause disturbs will be:

$$\text{Cost}(\overline{w})_{odd} = \qquad (7)$$
$$\alpha(T_{1 \to 1(odd)} + T_{1 \to 0(even)}) + \beta(T_{0 \to 0(odd)} + T_{0 \to 1(even)}) + kT_{odd}$$

where $T_{odd} = (T_{01 \to 10} + T_{10 \to 10})_{odd\text{-}even\text{-}pair} + (T_{01 \to 01} + T_{10 \to 01})_{even\text{-}odd\text{-}pair}$.

Similarly, the cost of writing even inverted data bits by extending the cost function described in equation (4) to include the coupling transitions will be:

$$\text{Cost}(\overline{w})_{even} = \qquad (8)$$
$$\alpha(T_{1 \to 1(even)} + T_{1 \to 0(odd)}) + \beta(T_{0 \to 0(even)} + T_{0 \to 1(odd)}) + kT_{even}$$

where $T_{even} = (T_{01 \to 10} + T_{10 \to 10})_{even\text{-}odd\text{-}pair} + (T_{01 \to 01} + T_{10 \to 01})_{odd\text{-}even\text{-}pair}$.

An illustrative example with thermal crosstalk follows. To illustrate the impact of write disturb on choosing the right encoding, we will use Table 7 to demonstrate this matter. For example, consider an 8-bit data w=10001010 to be written in place of the value x=00100010. If the decision is made based only on the number of updates by setting the k parameter in equations (5-8) to 0, which will effectively exclude thermal crosstalk effects, then minimum cost encoding would be to invert odd bits, thus resulting in a cost of 2. However, if parameter k is set to 3 in equations (5-8), thus including the effect of write disturbs, the algorithm will choose to invert all bits, which will have a cost of 6 in this case, and all the pairs which may lead to disturb faults are eliminated.

TABLE 7

Illustrative example including coupling transitions

| Case | $\alpha = 2, \beta = 1, \gamma = 0, \delta = 0, k = 0$ | $\alpha = 2, \beta = 1, \gamma = 0, \delta = 0, k = 3$ |
|---|---|---|
| Encoding | Invert bits at odd positions | Invert all bits |
| Encoded data | 00100000 | 01110101 |
| Cost | 2 | 6 |
| Cost summary | Cost(w) = 4, Cost($\overline{w}$) = 6, Cost($\overline{w}$)$_{odd}$ = 2, Cost($\overline{w}$)$_{even}$ = 8 | Cost(w) = 10, Cost($\overline{w}$) = 6, Cost($\overline{w}$)$_{odd}$ = 8, Cost($\overline{w}$)$_{even}$ = 8 |
| # of self-transitions | $T_{1 \to 0(odd)} = 1$, $T_{1 \to 0(even)} = 0$, $T_{1 \to 0} = 1$ $T_{0 \to 1(odd)} = 2$, $T_{0 \to 1(even)} = 0$, $T_{0 \to 1} = 2$ $T_{0 \to 0(odd)} = 0$, $T_{0 \to 0(even)} = 4$, $T_{0 \to 0} = 4$ $T_{1 \to 1(odd)} = 1$, $T_{1 \to 1(even)} = 0$, $T_{1 \to 1} = 1$ | |
| # of coupling transitions | $T_{01 \to 00} = 1$ $T_{10 \to 00} = 1$ $T_{01 \to 11} = 0$ $T_{10 \to 11} = 0$ $T_{01 \to 10(oep)} = 0$ $T_{10 \to 10(oep)} = 1$ $T_{01 \to 01(oep)} = 1$ $T_{10 \to 01(oep)} = 0$ $T_{01 \to 10(eop)} = 0$ $T_{10 \to 10(eop)} = 0$ $T_{01 \to 01(eop)} = 0$ $T_{10 \to 01(eop)} = 0$ oep means Odd-Even-Pair    eop means Even-Odd-Pair | |

Figure 4:
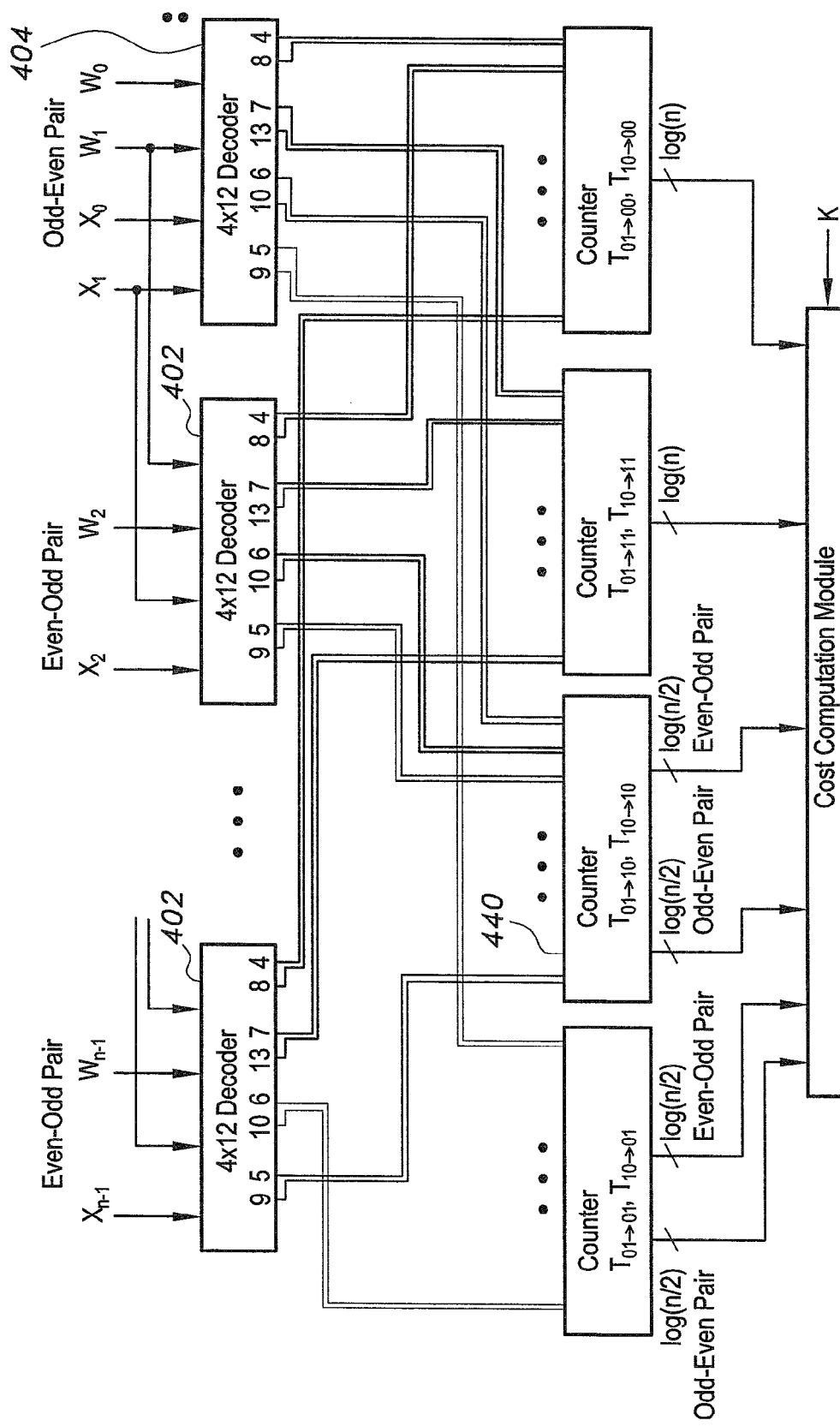
FIG. 4 is a block diagram showing coupling transition counting architecture in a system implementing odd/even invert coding for phase change memory with thermal crosstalk according to the present invention.

Regarding encoding architecture with thermal crosstalk, the architecture for counting coupling transitions is shown in FIG. 4. Since the coupling transitions happen between adjacent lines, each 4×12 decoder 402 takes two adjacent bits of inputs (e.g., $x_1 x_0 w_1 w_0$, $x_2 x_1 w_2 w_1$, $x_3 x_2 w_3 w_2$, etc.), where ($x_{n-1}, x_{n-2}, \ldots, x_1, x_0$) is old data and ($w_{n-1}, w_{n-2}, \ldots, w_1, w_0$) is new data to be written. The 4×12 decoder circuit 402 at the inputs detects the type of transition ($T_{01 \to 00}$, $T_{10 \to 00}$, $T_{01 \to 11}$, $T_{10 \to 11}$, $T_{01 \to 10}$, $T_{10 \to 10}$, $T_{01 \to 01}$, $T_{10 \to 01}$) based on its inputs ($x_i x_{i-1} w_i w_{i-1}$) and sets its corresponding output to "1" if any of the transition types is detected. The second stage is formed by a set of 4 counters 440, which count the number of 1's in their inputs, one counter for each coupling transition type based on equations (5-8). Each counter circuit 440 counts the number of 1's in their input and produces a count at its output with a bit size of $\log_2(n)$ where n is the size of data word. The outputs of counters are fed to a cost computation module 206, shown in detail in FIG. 2, which computes the cost according to equations (5-8).

It is to be understood that the present invention is not limited to the embodiments described above, but encompasses any and all embodiments within the scope of the following claims.

We claim:

1. A method for obtaining a minimum cost model for a computer system using odd/even invert coding for phase change memory (PCM) with thermal crosstalk performed by a dedicated electronic circuit, the method comprising the steps of:

providing an array of PCM cells configured in rows and columns, wherein each of the memory cells includes top and bottom electrodes, phase change material made from a chalcogenide alloy, and a heater;

reading a first word-size data stored in a location in the phase change memory;

computing a cost model capturing the phase change memory set/reset write asymmetries and write disturbs caused by thermal crosstalk for replacing the word read from PCM with a second word-size block of data in order to minimize total bit transitions and bit transitions susceptible to thermal crosstalk;

executing an odd/even invert data encoding/decoding algorithm, the algorithm making an intelligent decision selected from the group consisting of "no invert" (replacing the word read from PCM with the new word-size block of data without inverting the new word-size block of data), "full invert" (inverting all bits in the new word-size block of data before replacing the word read from PCM with the new word-size block of data), 'odd invert" (inverting only bits in odd-numbered positions in the new word-size block of data before replacing the word read from PCM with the new word-size block of data), and "even invert" (inverting only bits in even-numbered positions in the new word-size block of data before replacing the word read from PCM with the second word-size block of data) based on the cost model in order to provide a minimum cost solution, wherein the odd/even invert data encoding/decoding algorithm comprises the steps of:

computing cost according to equations characterized by the relations:

$$\text{Cost}(w) = \alpha T_{1\to 0} + \beta T_{0\to 1} + \gamma T_{0\to 0} + \delta T_{1\to 1},$$

$$\text{Cost}(\overline{w}) = \alpha T_{1\to 1} + \beta T_{0\to 0},$$

$$\text{Cost}(\overline{w})_{odd} = \alpha(T_{1\to 1(odd)} + T_{1\to 0(even)}) + \beta(T_{0\to 0(odd)} + T_{0\to 1(even)}), \text{ and}$$

$$\text{Cost}(\overline{w})_{even} = \alpha(T_{1\to 1(even)} + T_{1\to 0(odd)}) + \beta(T_{0\to 0(even)} + T_{0\to 1(odd)}),$$

where $T_{1\to 1}$, $T_{1\to 0}$, $T_{0\to 0}$, $T_{0\to 1}$ are the transitions for odd and even data bits stored by the PCM, w is the new word-size block of data, and $\alpha$, $\beta$, $\gamma$, $\delta$ are scaling factors for the bits in transition;

storing encoding bit odd=0 in a two-bit encoding code of the form odd, even;

storing encoding bit even=0 in the encoding code;

inverting even position bits in w and storing encoding bit even=1 in the encoding code if $\text{Cost}(\overline{w})_{even}$ is the minimum cost;

inverting odd position bits in w and storing encoding bit odd=1 in the encoding code if $\text{Cost}(\overline{w})_{odd}$ is the minimum cost;

inverting all bits in w, storing encoding bit even=1 in the encoding code, and storing encoding bit odd=1 in the encoding code if $\text{Cost}(\overline{w})$ is the minimum cost;

computing a thermal crosstalk inclusive cost function of writing the second word-size block of data w in the PCM, the thermal crosstalk inclusive cost function being:

$$\text{Cost}(w) = \alpha T_{1\to 0} + \beta T_{0\to 1} + \gamma T_{0\to 0} + \delta T_{1\to 1} + k(T_{01\to 00} + T_{10\to 00}),$$

where k is a scaling factor for even-odd pair coupling transitions in the cost function;

computing a thermal crosstalk inclusive cost function of writing inverted data including the coupling transitions, the inverted data writing cost function being:

$$\text{Cost}(\overline{w}) = \alpha T_{1\to 1} + \beta T_{0\to 0} + k(T_{01\to 11} + T_{10\to 11});$$

computing a disturb causing coupling transition inclusive odd position inverted data bit writing cost function characterized by the relation:

$$\text{Cost}(\overline{w})_{odd} = \alpha(T_{1\to 1(odd)} + T_{1\to 0(even)}) + \beta(T_{0\to 0(odd)} + T_{0\to 1(even)}) + kT_{odd},$$

where $T_{odd} = (T_{01\to 10} + T_{10\to 10})_{odd\text{-}even\text{-}pair} + (T_{01\to 01} + T_{10\to 01})_{even\text{-}odd\text{-}pair}$; and computing a disturb causing coupling transition inclusive even position inverted data bit writing cost function characterized by the relation:

$$\text{Cost}(\overline{w})_{even} = \alpha(T_{1\to 1(even)} + T_{1\to 0(odd)}) + \beta(T_{0\to 0(even)} + T_{0\to 1(odd)}) + kT_{even},$$

where $T_{even} = (T_{01\to 10} + T_{10\to 10})_{even\text{-}odd\text{-}pair} + (T_{01\to 01} + T_{10\to 01})_{odd\text{-}even\text{-}pair}$; and writing the obtained cost as the minimum cost for the odd/even invert coding as encoded data to the location in phase change memory.

2. The method for odd/even invert coding according to claim 1, further comprising the step of, during a write operation, using an encoder to encode the new data w to be written to the PCM, the encoder using pre-existing data, x read from the PCM to encode the new data w before being written to the PCM.

3. The method for odd/even invert coding according to claim 2, further comprising the step of, during a read operation, manipulating the read data word by a decoder to reconstruct an original value before being output from the PCM.

4. The method for odd/even invert coding according to claim 3, further comprising the step of, the decoder inverting the corresponding data bits based on the stored two-bit encoding code to restore the original/true value.

5. The method for odd/even invert coding according to claim 4, further comprising the steps of:
   not inverting data bits in w when the two-bit encoding code is 00;
   inverting even bits in w when two-bit encoding code is 01;
   inverting odd bits in w when the two-bit encoding code is 10; and
   inverting all bits in w when the two-bit encoding code is 11.

6. The method for odd/even invert coding according to claim 1, further comprising the steps of:
   decoding even-odd pairs of previously written (x) and current (w) data bits in data word W;
   decoding odd-even pairs of previously written (x) and current (w) data bits in data word W;
   counting the decoded even-odd pairs in data word W;
   counting the decoded odd-even pairs in data word W; and
   feeding results of the counting steps to the computation steps of claim 1.

7. An odd/even invert coding system for phase change memory (PCM) with thermal crosstalk to obtain a minimum cost model, the system comprising:
   phase change memory (PCM);
   an encoder accepting current data words W and previously stored data words X as input and providing an encoded output to the PCM;
   a decoder accepting encoded data words stored in the PCM and providing decoded data words as its output;
   means for computing a cost model capturing phase change memory (PCM) set/reset write asymmetries and write disturbs caused by thermal crosstalk for replacing X with W in order to minimize total bit transitions and bit transitions susceptible to thermal crosstalk;
   means for executing an odd/even invert data encoding/decoding algorithm, the algorithm making an intelligent decision selected from the group consisting of "no invert" (replacing X with W without inverting W), "full invert" (inverting all bits in W before replacing X with W), "odd invert" (inverting only bits in odd-numbered positions in W before replacing X with W), and "even invert" (inverting only bits in even-numbered positions in W before replacing X with W) based on the cost model in order to provide a minimum cost solution;
   means for computing cost according to equations characterized by the relations:

$$\text{Cost}(w) = \alpha T_{1\to 0} + \beta T_{0\to 1} + \gamma T_{0\to 0} + \delta T_{1\to 1},$$

$$\text{Cost}(\overline{w}) = \alpha T_{1\to 1} + \beta T_{0\to 0},$$

$$\text{Cost}(\overline{w})_{odd} = \alpha(T_{1\to 1(odd)} + T_{1\to 0(even)}) + \beta(T_{0\to 0(odd)} + T_{0\to 1(even)}), \text{ and}$$

$$\text{Cost}(\overline{w})_{even} = \alpha(T_{1\to 1(even)} + T_{1\to 0(odd)}) + \beta(T_{0\to 0(even)} + T_{0\to 1(odd)}), \text{ where}$$

$T_{1\to 1}$, $T_{1\to 0}$, $T_{0\to 0}$, $T_{0\to 1}$ are the transitions for odd and even data bits stored by the PCM, w is the new word-size block of data, and $\alpha$, $\beta$, $\gamma$, $\delta$ are scaling factors for the bits in transition;

means for storing encoding bit odd=0 in a two-bit encoding code of the form odd, even;

means for storing encoding bit even=0 in the encoding code;

means for inverting even position bits in w and storing encoding bit even=1 in the encoding code if $\text{Cost}(\overline{w})_{even}$ is the minimum cost;

means for inverting odd position bits in w and storing encoding bit odd=1 in the encoding code if $\text{Cost}(\overline{w})_{odd}$ is the minimum cost;

means for inverting all bits in w, storing encoding bit even=1 in the encoding code, and storing encoding bit odd=1 in the encoding code if $\text{Cost}(\overline{w})$ is the minimum cost;

means for computing a thermal crosstalk inclusive cost function of writing the new word-size block of data w in the PCM, the thermal crosstalk inclusive cost function being:

$$\text{Cost}(w) = \alpha T_{1\to 0} + \beta T_{0\to 1} + \gamma T_{0\to 0} + \delta T_{1\to 1} + k(T_{01\to 00} + T_{10\to 00}),$$

where k is a scaling factor for even-odd pair coupling transitions in the cost function;

means for computing a thermal crosstalk inclusive cost function of writing inverted data including the coupling transitions, the inverted data writing cost function being:

$$\text{Cost}(\overline{w}) = \alpha T_{1\to 1} + \beta T_{0\to 0} + k(T_{01\to 11} + T_{10\to 11});$$

means for computing a disturb causing coupling transition inclusive odd position inverted data bit writing cost function characterized by the relation:

$$\text{Cost}(\overline{w})_{odd} = \alpha(T_{1\to 1(odd)} + T_{1\to 0(even)}) + \beta(T_{0\to 0(odd)} + T_{0\to 1(even)}) + kT_{odd},$$

where $T_{odd} = (T_{01\to 10} + T_{10\to 10})_{odd\text{-}even\text{-}pair} + (T_{01\to 01} + T_{10\to 01})_{even\text{-}odd\text{-}pair}$; and means for computing a disturb causing coupling transition inclusive even position inverted data bit writing cost function characterized by the relation:

$$\text{Cost}(\overline{w})_{even} = \alpha(T_{1\to 1(even)} + T_{1\to 0(odd)}) + \beta(T_{0\to 0(even)} + T_{0\to 1(odd)}) + kT_{even},$$

where $T_{even} = (T_{01\to 10} + T_{10\to 10})_{even\text{-}odd\text{-}pair} + (T_{01\to 01} + T_{10\to 01})_{odd\text{-}even\text{-}pair}$; and means for writing the cost solution as encoded data to the phase change memory.

8. The odd/even invert coding system according to claim 7, further comprising, during a write operation, means for using the encoder to encode the new data w to be written to the PCM, the encoder using pre-existing data, x, read from the PCM to encode the new data w before being written to the PCM.

9. The odd/even invert coding system according to claim 8, further comprising, during a read operation, means for manipulating the read data word by the decoder to reconstruct the original value w before being output from the PCM.

10. The odd/even invert coding system according to claim 9, further comprising means for inverting the corresponding data bits based on the stored two-bit encoding code to restore the original/true value of w.

11. The odd/even invert coding system according to claim 10, further comprising:

means for not inverting data bits in w when the two-bit encoding code is 00;

means for inverting even bits in w when the two-bit encoding code is 01;

means for inverting odd bits in w when the two-bit encoding code is 10; and means for inverting all bits in w when the two-bit encoding code is 11.

12. The odd/even invert coding system according to claim 7, further comprising:

means for decoding even-odd pairs of previously written (x) and current (w) data bits in data word W;

means for decoding odd-even pairs of previously written (x) and current (w) data bits in data word W;

means for counting the decoded even-odd pairs in data word W;

means for counting the decoded odd-even pairs in data word W; and means for feeding results of the counting steps to the computation means of claim 7.

* * * * *